United States Patent [19]
Lim

[11] Patent Number: 5,929,680
[45] Date of Patent: Jul. 27, 1999

[54] SHORT CIRCUIT REDUCED CMOS BUFFER CIRCUIT

[75] Inventor: Swee Hock Alvin Lim, Singapore, Singapore

[73] Assignee: Tritech Microelectronics International Ltd, Singapore, Singapore

[21] Appl. No.: 08/857,960

[22] Filed: May 16, 1997

[51] Int. Cl.⁶ .......................... H03K 17/16; H03K 17/687
[52] U.S. Cl. .......................... 327/264; 327/391; 327/437; 326/27
[58] Field of Search ...................................... 327/437, 384, 327/389, 391, 112, 264, 285; 326/26, 27, 82, 83; 330/264, 269

[56] References Cited

U.S. PATENT DOCUMENTS

| 4,779,015 | 10/1988 | Erdelyi | 326/71 |
| 4,785,203 | 11/1988 | Nakamura | 326/87 |
| 4,789,796 | 12/1988 | Foss | 326/27 |
| 4,827,159 | 5/1989 | Naganuma | 326/27 |
| 5,025,181 | 6/1991 | Farmer | 327/437 |
| 5,034,623 | 7/1991 | McAdams | 327/74 |
| 5,061,864 | 10/1991 | Rogers | 326/87 |
| 5,149,990 | 9/1992 | Yamazaki et al. | 326/21 |
| 5,216,300 | 6/1993 | Wabuka | 326/87 |
| 5,296,766 | 3/1994 | Masaki | 327/387 |
| 5,399,924 | 3/1995 | Goetting et al. | 326/45 |
| 5,455,520 | 10/1995 | Honda | 326/86 |
| 5,500,610 | 3/1996 | Burstein | 326/27 |
| 5,519,344 | 5/1996 | Probesting | 326/17 |
| 5,672,983 | 9/1997 | Yamamoto et al. | 326/27 |

*Primary Examiner*—Tim Callahan
*Assistant Examiner*—Terry L. Englund
*Attorney, Agent, or Firm*—George O. Saile; Stephen B. Ackerman

[57] ABSTRACT

In this invention is described a CMOS buffer that reduces short circuit current in the output stage. The short circuit current is a result of current flowing between circuit bias and ground through the output transistors during switching transition. The reduction in shorting current is accomplished by driving the two CMOS output transistors of opposite type separately, and providing a turn off signal for one output transistor ahead of the turn on signal for the other transistor. Thus one transistor is turned off before the other transistor is turned on, reducing shorting between the two transistors. The on and off signal delay is controlled from unbalanced inverters connected separately to each input of the output transistors.

2 Claims, 2 Drawing Sheets

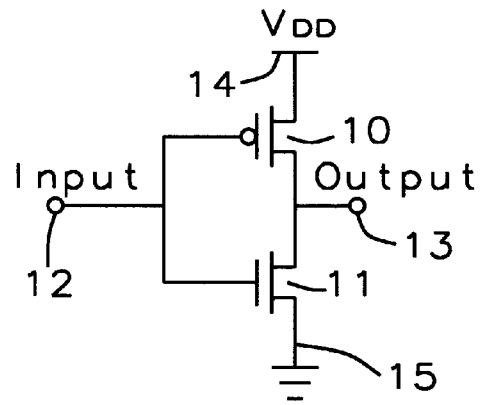
*FIG. 1a - Prior Art*
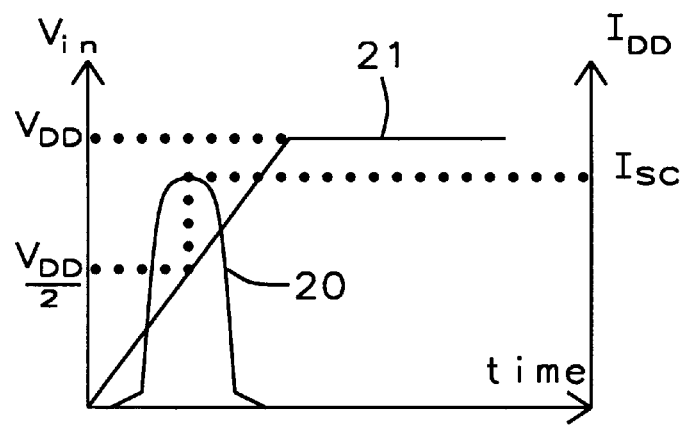
*FIG. 1b - Prior Art*
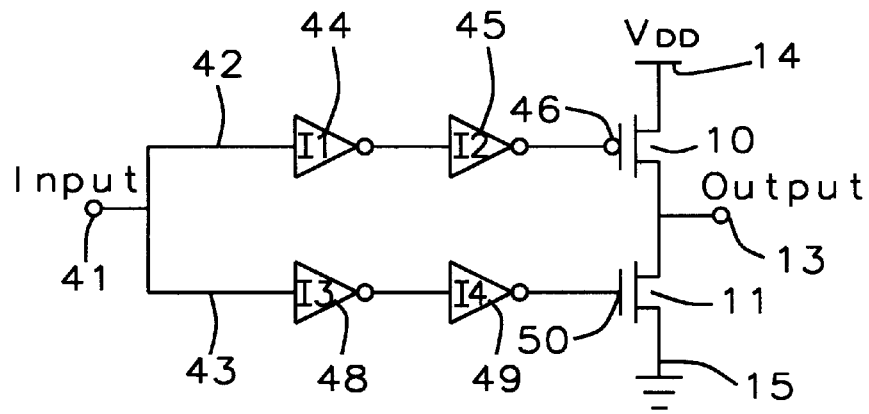
*FIG. 2*

SHORT CIRCUIT REDUCED CMOS BUFFER CIRCUIT

BACKGROUND OF THE INVENTION

1. Field of Invention

This invention is related to semiconductor integrated circuits and in particular to reducing short circuit current at the output of a CMOS buffer circuit.

2. Description of Related Art

In the buffering of signals there is a need to not only shape the incoming signal but to provide an output that is free from output signal perturbations including the circuit power lines. These perturbations can be caused by a shorting effect in a CMOS buffer output devices of opposite conductivity where one transistor turns on while the other transistor turns off. During the transition both transistors of opposite conductivity, connected to each other and to opposite power lines can provide a path for current to flow from one power line to the other. This shorting current increases power consumption, particularly with drivers that have been bulked up to drive large loads like clock drivers and also produces a noise spike on the power lines. Present practice to reduce this shorting includes trying to control the switching of the output transistors of the CMOS buffer circuit by use of a flip flop like latch connected to the input gate of each output transistor of the CMOS buffer circuit.

In U.S. Pat. No. 4,779,015 (Erdelyi) a low input signal buffer circuit is described where the inverters between the input and the output have fast switching action to reshape the incoming signal into a desired amplitude and pulse width. Referring to U.S. Pat. No. 5,034,623 a low power TTL level CMOS buffer is described where the high and low trip points of the circuitry can be changed by appropriately sizing the transistors. Hysteresis is introduced into the circuitry to control oscillations and to react to a range of TTL signals. In U.S. Pat. No. 5,399,924 (Goetting et al.) is a low power inverter circuit which can be configured to be a conventional CMOS inverter in which the circuit can be switched between an inverting and non-inverting buffer.

In the references, the same basic CMOS inverter was used associated with other logic to accomplish various functions and to minimize power consumption. None of these provided for the protection of shorting at the output transistors which becomes important when the transistors of opposite conductivity in the CMOS inverter are switched from "on" to "off" and "off" to "on" simultaneously.

SUMMARY OF THE INVENTION

This invention describes a CMOS buffer circuit configured to reduce short circuit current flowing between the circuit power lines through the output transistors of opposite conductivity and connected in series between voltage bias and ground. The output stage of the buffer circuit is a CMOS inverter circuit where the input gates of the P-channel transistor and the N-channel transistor are each controlled separately by a different pair of inverter circuits connected in series. The input of the first inverter circuit of each pair of inverter circuits is connected together to form the input of the CMOS buffer circuit. The output of the second inverter circuit of each pair of inverter circuits is connected to the output transistors of the buffer circuit such that each pair of inverter circuits control separately each of the output transistors. A signal at the input of the buffer circuit flows through two different circuit paths. The first path being the first two inverters connected in series and connected to the gate of the output P-channel transistor. The second path being the second two inverters connected in series and connected to the gate of the output N-channel transistor.

Each pair of the inverter circuits connected to the different output transistors of the buffer circuit are adjusted to be unbalanced by setting the width to length ratio of each of the inverter circuit transistors to be different and to produce different signal delays of the input signal flowing to the two input gates of the output transistors. Thus an input signal which turns on the P-channel transistor and turns off the N-channel transistor arrives at the output N-channel transistor before arriving at the output P-channel transistor. The N-channel transistor is turned off before the P-channel transistor is turned on. In like manner, a signal that turns off the P-channel transistor and turns on the N-channel transistor arrives at the output P-channel transistor before arriving at the output N-channel transistor. The P-channel transistor is turned off before the N-channel transistor is turned on. The transitional time that both the output P-channel transistor and the output N-channel transistor are "on" simultaneously is reduced or eliminated depending on the different width to length ratios used for each transistor of the two pairs of series connected inverter circuits.

BRIEF DESCRIPTION OF THE DRAWINGS

This invention will be described with reference to the accompanying drawings, wherein:

FIG. 1a is a circuit diagram of a CMOS inverter circuit of prior art, and

FIG. 1b shows the shorting current of the inverter circuit of prior art, and

FIG. 2 is a circuit diagram of the buffer with multiple inverter stages for delaying the input signal to reduce shorting in the output stage.

DETAILED DESCRIPTION OF THE PREFERRED EMBODIMENT

Figure 3A:
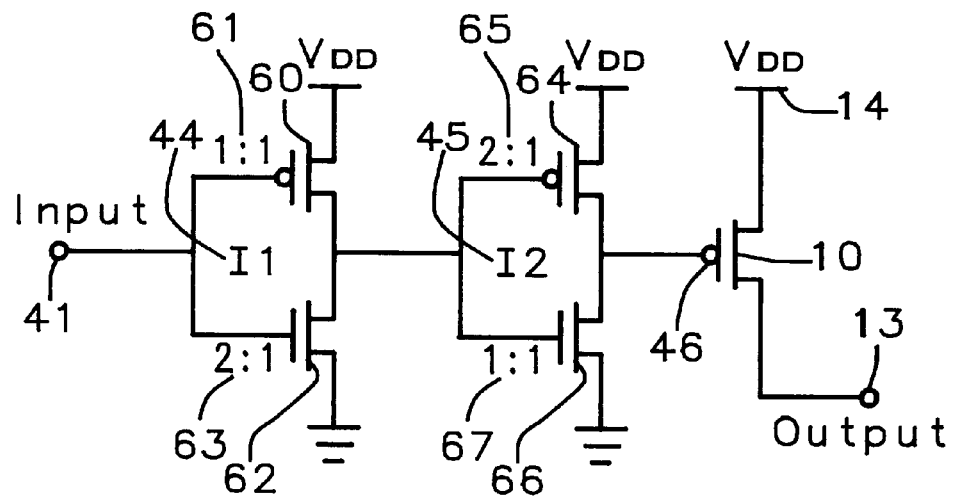
FIG. 3a is the circuit diagram of the inverter circuits connected to the input of the output circuit P-channel transistor.

Shown in FIG. 1a is a CMOS inverter circuit often used as a buffer circuit to drive large loads in which several of these buffer circuits are connected in series to bulk up the drive capability. The inverter circuit is made up of a P-channel transistor 10 connected in series with an N-channel transistor 11 between voltage bias ($V_{DD}$) 14 and circuit ground 15. The juncture of the P-channel transistor 10 and the N-channel transistor 11 is the inverter circuit output 13, and the connection of the transistor gates is the inverter circuit input 12. When a signal is applied to the input 12, one transistor turns off and the other simultaneously turns on. This produces a short circuit current ($I_{SC}$) 20 as shown in FIG. 1b that flows from voltage bias 14 to circuit ground 15 through the P-channel transistor 10 and the N-channel transistor 11. This shorting current 20 occurs in time near the mid-point ($V_{DD}/2$) of the input voltage transition 21 for both a rising input voltage, shown in FIG. 1b, or a falling input voltage. Besides putting noise spikes on the circuit power lines, the short circuit current also increases the power dissipation of the CMOS circuitry.

In FIG. 2 is shown a buffer circuit having a P-channel transistor 10 and an N-channel transistor 11 connected in series between voltage bias ($V_{DD}$) 14 and circuit ground 15. The juncture of the P-channel and N-channel transistors forms the output 13 of the buffer circuit. The gate 46 of the P-channel transistor 10 is driven by a first and second inverter circuit ($I_1$ and $I_2$) 44 45 connected in series. The gate 50 of the N-channel transistor 11 is driven by a third and fourth inverter circuit ($I_3$ and $I_4$) 48 49 connected in series. The input 42 to the first inverter circuit ($I_1$) 44 is connected to the input 43 of the third inverter circuit ($I_3$) 48 to form the buffer circuit input 41. The inverter circuits 44 45 48 49 are unbalanced such that a signal applied at the buffer input 41 that turns off the output P-channel transistor 10 arrives at the gate 46 of the N-channel transistor 10 before the signal that turns on the output N-channel transistor 11 arrives at the gate 50 of the N-channel transistor 11. Similarly a signal that is applied at the buffer input 41 that turns off the output N-channel transistor 11 arrives at the gate 50 of the N-channel transistor 11 before the signal that turns on the P-channel transistor 10 arrives at the gate 46 of the P-channel transistor.

Figure 3B:
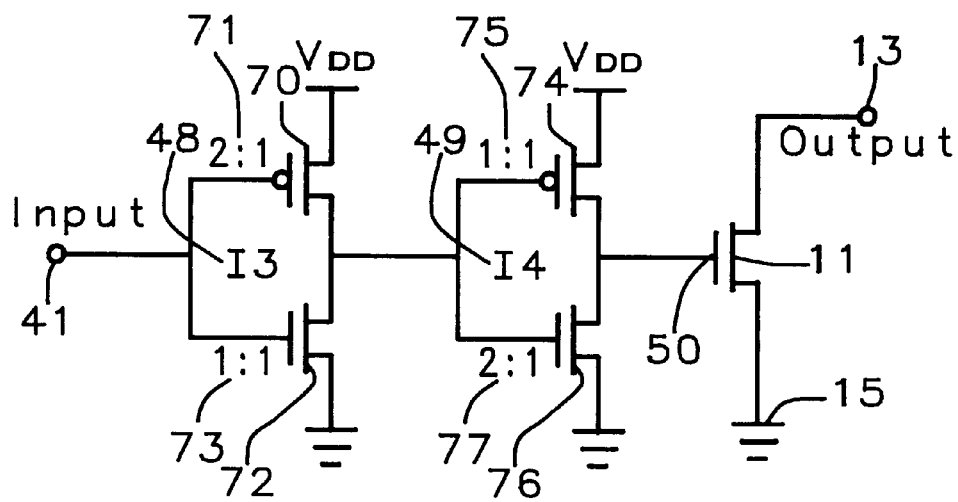
FIG. 3b is the circuit diagram of the inverter circuits connected to the input of the output circuit N-channel transistor.

In FIG. 3a and 3b is shown the means by which the first and second inverter circuits ($I_1$ and $I_2$) 44 45 and the third and fourth inverter circuits ($I_3$ and $I_4$) 48 49 are unbalanced to produce the different signal delays to the gates 46 50 of the buffer circuit output transistors 10 11. In FIG. 3a is shown an expanded view of the first and second inverter circuits 44 45 connected between buffer circuit input 41 and the gate 46 of buffer circuit output P-channel transistor 10. The P-channel transistor 60 of the first inverter circuit ($I_1$) 44 has a channel width to length ratio of one to one 61, and the N-channel transistor 62 has a channel width to length ratio of two to one 63. The P-channel transistor 64 of the second inverter circuit ($I_2$) 45 has a channel width to length ratio of two to one 65, and the N-channel transistor 66 has a channel width to length ratio of one to one 67.

In FIG. 3b is shown an expanded view of the third and fourth inverter circuits 48 49 connected between butter circuit input 41 and the gate 50 of buffer circuit output N-channel transistor 11. The P-channel transistor 70 of the third inverter circuit ($I_3$) 48 has a channel width to length ratio of two to one 71, and the N-channel transistor 72 has a channel width to length ratio of one to one 73. The P-channel transistor 74 of the fourth inverter circuit ($I_4$) 49 has a channel width to length ratio of one to one 75, and the N-channel transistor 76 has a channel width to length ratio of two to one 77.

The larger channel width to length ratios 63 65 71 77 shown in FIG. 3a and FIG. 3b produce more current to charge circuit capacitance more quickly and produce a shorter delay than the one to one channel width to length ratios 61 67 73 75. A signal going from a low value to a high value at the buffer circuit input 41 will flow through N-channel transistor 62 of the first inverter circuit 44 and the P-channel transistor 64 of the second inverter circuit 45 arriving at the gate 46 to turn off the output P-channel transistor 10 before the input signal arrives at the gate 50 to turn on the output N-channel transistor 11. The signal going from a low value to a high value at the buffer circuit input 41 will flow through N-channel transistor 72 of the third inverter circuit 48 and the P-channel transistor 74 of the fourth inverter circuit 49 arriving at the gate 50 to turn on the output N-channel transistor 11 after the input signal arrives at the gate 46 to turn off the output P-channel transistor 10.

Continuing to refer to FIG. 3a and FIG. 3b, a signal going from a high value to a low value at the buffer circuit input 41 will flow through P-channel transistor 60 of the first inverter circuit 44 and the N-channel transistor 66 of the second inverter circuit 45 arriving at the gate 46 to turn on the output P-channel transistor 10 after the input signal arrives at the gate 50 to turn off the output N-channel transistor 11. The signal going from a low value to a high value at the buffer circuit input 41 will flow through P-channel transistor 70 of the third inverter circuit 48 and the N-channel transistor 76 of the fourth inverter circuit 49 arriving at the gate 50 to turn off the output N-channel transistor 11 before the input signal arrives at the gate 46 to turn on the output P-channel transistor 10.

Thus the buffer circuit output transistors 10 11 receive a turn off signal prior in tie to a turn on signal at their respective gates. This difference in delay reduces the transitional time that both buffer circuit output transistors 10 11 can be on simultaneously and thereby reduces the short circuit current flowing between circuit power lines 14 15. The transistor channel width to length ratios 61 67 73 75 and 63 65 71 77 are values that are appropriate for a particular semiconductor process and may be different for another process having different characteristics. The difference in the two ratios is tic necessary parameter to effect the difference in delays. This difference between the width to length ratios as shown in FIG. 3a and FIG. 3b may also vary for different processes.

While the invention has been particularly shown and described with reference to preferred embodiments thereof, it will be understood by those skilled in the art that various changes in form and details may be made without departing from the spirit and scope of the invention.

What is claimed is:

1. A buffer circuit with unbalanced inverter circuits to reduce short circuit current in the buffer circuit output stage, comprising:

a) a buffer circuit output P-channel transistor connected in series with a buffer circuit output N-channel transistor between circuit bias and circuit ground, b) an output of the buffer circuit being a connection between the buffer circuit output P-channel transistor and the buffer circuit output N-channel transistor, c) input gate of the buffer circuit output P-channel transistor controlled by first and second inverter circuits connected in series, d) input gate of the buffer circuit output N-channel transistor controlled by third and fourth inverter circuits connected in series, e) an input of the buffer circuit being a connection between inputs of the first inverter circuit and the third inverter circuit, f) the first and the second inverter circuits are unbalanced such that a signal that will turn off said buffer circuit output P-channel transistor has less delay than a signal through said third and said fourth inverter circuits that will turn on the buffer circuit output N-channel transistor, g) said third and said fourth inverter circuits are unbalanced such that a signal that will turn off said buffer circuit output N-channel transistor has less delay than a signal through said first and said second inverter circuits that will turn on the buffer circuit output P-channel transistor, h) a delay difference between signal propagating through the first and the second inverter circuits and the third and the fourth inverter circuits reducing a time when the buffer circuit output P-channel transistor and the buffer circuit output N-channel transistor are on simultaneously and reducing the short circuit current flowing between circuit bias and circuit ground, i) each of said inverter circuits comprises a pair of CMOS transistors, and a width to length ratio for each said CMOS transistor in the first and second inverter circuits and the third and the fourth inverter circuits are adjusted to produce said delay difference, comprising:

1) said first inverter circuit consisting of a P-channel transistor connected to an N channel transistor between circuit bias and circuit ground forming at their juncture an output of the first inverter circuit and with their gates connected together as said input of the first inverter circuit,
2) the P-channel transistor of the first inverter circuit having a channel width and length being about equal size and the N-channel transistor of the first inverter circuit having a channel width to length ratio of greater than one to one,
3) said second inverter circuit consisting of a P-channel transistor connected to an N channel transistor between circuit bias and circuit ground forming at their juncture an output of the second inverter circuit and with their gates connected together as an input of the second inverter circuit,
4) the P-channel transistor of the second inverter circuit having a channel width to length ratio of greater than one to one and the N-channel transistor of the second inverter circuit having a channel width and length being about equal size,
5) said input of the second inverter circuit is connected to the output of the first inverter circuit and said output of the second inverter circuit is connected to the input gate of the buffer circuit output P-channel transistor,
6) said third inverter circuit consisting of a P-channel transistor connected to an N channel transistor between circuit bias and circuit ground forming at their juncture an output of the third inverter circuit and with their gates connected together as said input of the third inverter circuit,
7) the P-channel transistor of the third inverter circuit having a channel width to length ratio of greater than one to one and the N-channel transistor of the third inverter circuit having a channel width and length being about equal size,
8) said input of the third inverter circuit connected to the input of the first inverter circuit forming the input of the buffer circuit,
9) said fourth inverter circuit consisting of a P-channel transistor connected to an N channel transistor between circuit bias and circuit ground forming at their juncture an output of the fourth inverter circuit and with their gates connected together as an input of the fourth inverter circuit,
10) the P-channel transistor of the fourth inverter circuit having a channel width and length being about equal size and the N-channel transistor of the fourth inverter circuit having a channel width to length ratio of greater than one to one, and
11) said input of the fourth inverter circuit is connected to the output of the third inverter circuit and said output of the fourth inverter circuit is connected to the input gate of the buffer circuit output N-channel transistor.

2. The buffer circuit of claim 1, wherein an input signal will propagate through a combination of the first inverter circuit and the second inverter circuit at a different delay than through a combination of the third inverter circuit and the fourth inverter circuit comprising:

a) a change from a low to a high input signal at the buffer circuit input propagates through the N-channel transistor of the first inverter circuit having the width to length ratio of greater than one to one and the P-channel transistor of the second inverter circuit having the width to length ratio of greater than one to one,
b) the change from the low to the high input signal at the buffer circuit input will propagate through the N-channel transistor of the third inverter circuit having the channel width and length that are about equal size and the P-channel transistor of the fourth inverter circuit having the channel width and length that are about equal size,
c) the low to the high input signal reaching the input gate of the buffer circuit output P-channel transistor sooner in time than the low to the high input signal reaching the input gate of the buffer circuit output N-channel transistor, turning off the buffer circuit output P-channel transistor before the buffer circuit output N-channel transistor turns on,
d) a change from the high to the low input signal at the buffer circuit input will propagate through the P-channel transistor of the first inverter circuit having the channel width and length that are about equal size and the N-channel transistor of the second inverter circuit having the channel width and length that are about equal size,
e) the change from the high to the low input signal at the buffer circuit input will propagate through the P-channel transistor of the third inverter circuit having the width to length ratio of greater than one to one and the N-channel transistor of the fourth inverter circuit having the width to length ratio of greater than one to one, and
f) the high to the low input signal reaching the input gate of the buffer circuit output N-channel transistor sooner in time than the high to the low input signal reaching the input gate of the buffer circuit output P-channel transistor, turning off the buffer circuit output N-channel transistor before the buffer circuit output P-channel transistor turns on.

* * * * *